United States Patent
Zhang et al.

(10) Patent No.: US 11,316,513 B2
(45) Date of Patent: Apr. 26, 2022

(54) GATE DRIVER

(71) Applicant: Hamilton Sundstrand Corporation, Charlotte, NC (US)

(72) Inventors: Chi Zhang, Cork (IE); Sebastian Pedro Rosado, Cork (IE)

(73) Assignee: HAMILTON SUNDSTRAND CORPORATION, Charlotte, NC (US)

(*) Notice: Subject to any disclaimer, the term of this patent is extended or adjusted under 35 U.S.C. 154(b) by 0 days.

(21) Appl. No.: 17/064,035

(22) Filed: Oct. 6, 2020

(65) Prior Publication Data

US 2021/0211124 A1 Jul. 8, 2021

(30) Foreign Application Priority Data

Jan. 7, 2020 (EP) .................... 20275003

(51) Int. Cl.
- *H02M 1/08* (2006.01)
- *H03K 17/16* (2006.01)
- *H02M 1/00* (2006.01)

(52) U.S. Cl.
CPC ............ *H03K 17/165* (2013.01); *H02M 1/08* (2013.01); *H02M 1/0009* (2021.05)

(58) Field of Classification Search
CPC ............ H02M 1/08; H02M 2001/0009; H03K 17/165

(Continued)

(56) References Cited

U.S. PATENT DOCUMENTS

| 7,046,051 B2* | 5/2006 | Melbert | H03K 17/166 |
| | | | 327/110 |
| 8,710,876 B2 | 4/2014 | Lobsiger et al. | |

(Continued)

FOREIGN PATENT DOCUMENTS

| EP | 2816728 A1 | 12/2014 | |
| EP | 3322093 A1 | 5/2018 | |
| GB | 2589296 A * | 6/2021 | ........... H03K 17/166 |

OTHER PUBLICATIONS

European Search Report for Application No. 20275003.0, dated Jun. 17, 2020, 9 pages.

*Primary Examiner* — William Hernandez
(74) *Attorney, Agent, or Firm* — Cantor Colburn LLP

(57) ABSTRACT

A gate driver circuit for driving a gate-controlled switching device comprises a voltage monitor circuit portion arranged to produce a first value that is dependent on a time derivative (dv/dt) of a voltage applied across the gate-controlled switching device. A current monitor circuit portion is arranged to produce a second value that is dependent on a time derivative (di/dt) of a current through the gate-controlled switching device. A compensator is arranged to receive an alternating input signal ($PWM_{ref}$), the first value, and the second value, wherein the compensator modulates a magnitude and transition profile of the alternating input signal ($PWM_{ref}$) in response to the respective time derivatives of the voltage and the current, thereby generating a modulated control signal ($PWM_N$). The gate driver circuit supplies the modulated control signal ($PWM_N$) to the gate terminal of the gate-controlled switching device.

17 Claims, 11 Drawing Sheets

(58) Field of Classification Search
USPC .................................................. 327/108, 109
See application file for complete search history.

(56) References Cited

U.S. PATENT DOCUMENTS

| | | | |
|---|---|---|---|
| 8,985,850 | B1 | 3/2015 | Godbole et al. |
| 9,007,102 | B2 | 4/2015 | Lobsiger et al. |
| 9,030,054 | B2 | 5/2015 | Jacobson et al. |
| 9,438,228 | B2 | 9/2016 | Peng et al. |
| 9,741,283 | B2 | 8/2017 | Lee |
| 10,461,732 | B1* | 10/2019 | Norling ................ H03K 17/168 |
| 2008/0204087 | A1* | 8/2008 | Schwarzer ........... H03K 17/567 |
| | | | 327/109 |
| 2010/0060326 | A1* | 3/2010 | Palmer ................ H03K 17/168 |
| | | | 327/109 |
| 2016/0352316 | A1* | 12/2016 | Akama ................... G05F 1/565 |
| 2017/0040802 | A1* | 2/2017 | Hopperdietzel ..... H03K 17/165 |
| 2019/0074827 | A1* | 3/2019 | Norling ............. H03K 17/0828 |

* cited by examiner

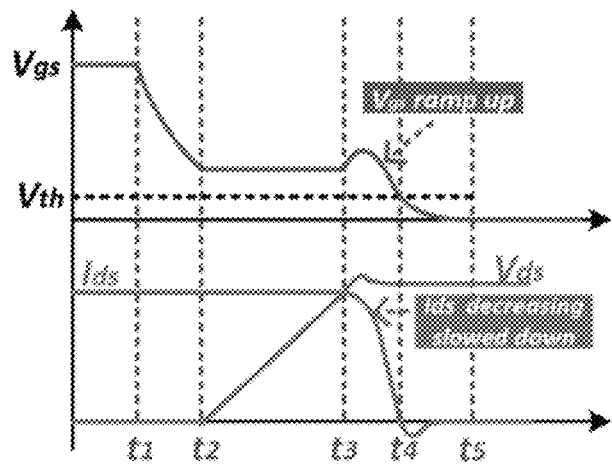 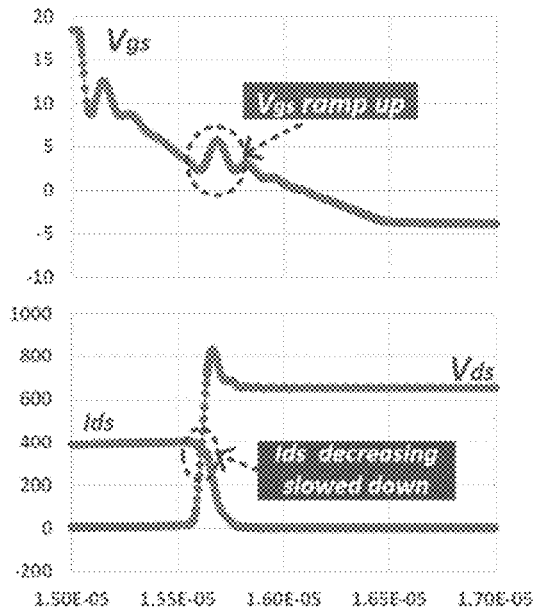
Fig. 7A  Fig. 7B
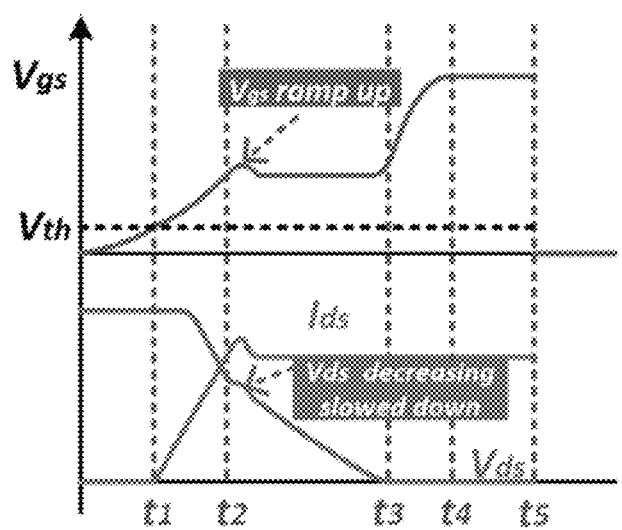 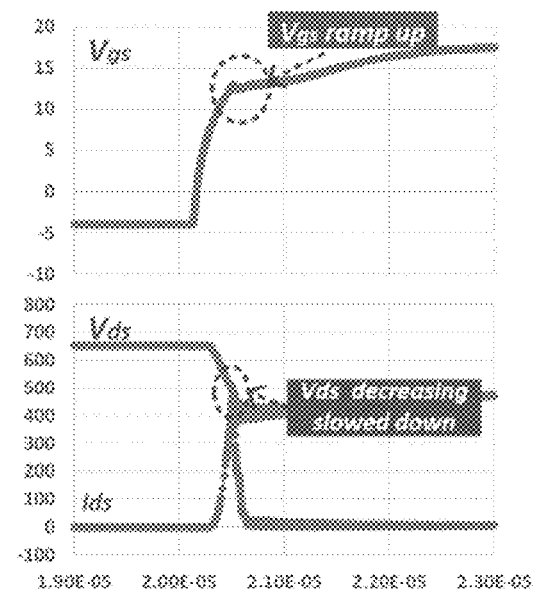
Fig. 7C  Fig. 7D

GATE DRIVER

FOREIGN PRIORITY

This application claims priority to European Patent Application No. 20275003.0 filed Jan. 7, 2020, the entire contents of which is incorporated herein by reference.

TECHNICAL FIELD

This disclosure relates to an adaptive gate driver, in particular a gate driver suitable for driving wide band gap devices, including but not limited to silicon carbide devices.

BACKGROUND ART

Along with the electrification for the aircraft, power electronics converter is playing an increasingly important role in aircraft systems. Due to the requirement for high power density and low physical device volume, e.g. to drive high speed motors, wide band gap devices have become quite attractive for use in power electronics converter design. Wide band gap devices are particularly advantageous because of their relatively fast switching speeds with relatively low power dissipation during switching (i.e. transitioning between its on and off states). Such wide band gap devices include, for example, silicon carbide (SiC) transistors.

However, the selection of such wide band gap devices results in some issues. Specifically, due to the fast switching speed and the associated increase in voltage and current ringing compared to other (i.e. non wide band gap) switching devices, the power converter system may suffer from significant electromagnetic interference (EMI) issues, resulting in an associated increase in loss to the system. The voltage and/or current ringing may also themselves result in additional loss to the power converter system. The voltage and current ringing can be seen in FIG. 1, which is a graph of the current and voltage (y-axes) against time (x-axis) for a typical SiC device. Both the current and voltage exhibit significant oscillations following the SiC being switched on or off.

These additional losses and EMI have a negative impact on system efficiency, generally resulting in an additional external cooling capability being needed, which will typically increase the volume and/or cost of the power converter and decrease the power density of the power converter.

Additionally, the ringing (i.e. oscillations) in current and voltage generally cause electromagnetic interference (EMI) during the turning on and off processes. The resulting EMI generally makes both printed circuit board (PCB) and system design more challenging.

Typically, in order to suppress the voltage/current ringing, large gate resistors Rg are used (i.e. a large resistance is presented at the gate of the transistor), as can be seen in the conventional gate driver circuit 102 of FIG. 11, known in the art per se. A signal generator 103 supplies a switching signal $PWM_{ref}$ to the base terminals of a push-pull pair of BJTs 108, 110. The emitter terminals of these BJTs 108, 110 are connected together via respective gate resistors Rg_on_large, Rg_off_large, where a node between these resistors Rg_on_large, Rg_off_large is connected to the gate terminal of the transistor to be driven.

However, the use of such a large gate resistance results in much higher switching losses for the devices, which is not desired, as can be seen in FIG. 2, which is a graph that shows a performance comparison between relatively small and large gate resistances.

In order to suppress this ringing and drive the power device in a more efficient and intelligent way, existing approaches, known in the art per se, modulate the gate voltage of the SiC device. For example, a gate voltage profile may be tested in advance and stored in the driver circuit, i.e. an optimisation profile may be stored for later use. However, this optimisation is based on only one current point. If the actual current varies from the pre-optimised current/voltage point, the performance may be significantly degraded.

In order to overcome this drawback, a feedback loop could be inserted in the system by measuring the current or voltage of the device. Based on different voltage or current feedback, the gate driver may choose the optimal gate voltage profile that has been already tested in advance. Nevertheless, such an approach requires quite a large amount of work in order to test desired gate voltage profile for different switching voltage and/or current conditions.

The present disclosure seeks to address the issues outlined above and to provide an improved gate driver.

SUMMARY OF THE DISCLOSURE

In accordance with a first aspect, the present disclosure provides a gate driver circuit for driving a gate-controlled switching device. The gate driver includes a voltage monitor circuit portion arranged to produce a first value that is dependent on a time derivative of a voltage applied across the gate-controlled switching device and a current monitor circuit portion arranged to produce a second value that is dependent on a time derivative of a current through the gate-controlled switching device. The circuit also includes a compensator arranged to receive an alternating input signal, the first value that is dependent on the time derivative of the voltage, and the second value that is dependent on the time derivative of the current, wherein the compensator is arranged to modulate a magnitude and transition profile of the alternating input signal in response to the respective time derivatives of the voltage and the current, thereby generating a modulated control signal. In this aspect, the gate driver circuit is arranged to supply the modulated control signal to a gate terminal of the gate-controlled switching device.

The gate driver may, in some examples, be part of a power converter. Thus, the first aspect of the disclosure extends to a power converter comprising a gate-controlled switching device connected between an input terminal and an output terminal. The power converter further includes a gate driver comprising: a voltage monitor circuit portion arranged to produce a first value that is dependent on a time derivative of a voltage applied across the gate-controlled switching device; a current monitor circuit portion arranged to produce a second value that is dependent on a time derivative of a current through the gate-controlled switching device; and a compensator arranged to receive an alternating input signal, the first value that is dependent on the time derivative of the voltage, and the second value that is dependent on the time derivative of the current, wherein the compensator is arranged to modulate a magnitude and transition profile of the alternating input signal in response to the respective time derivatives of the voltage and the current, thereby generating a modulated control signal. The gate driver circuit is arranged to supply the modulated control signal to a gate terminal of the gate-controlled switching device.

The first aspect of the disclosure also extends to a method of driving a gate-controlled switching device. The method includes: producing a first value dependent on a time derivative of a voltage across the gate-controlled switching device; producing a second value dependent on a time derivative of a current through the gate-controlled switching device; modulating a magnitude and transition profile of an alternating input signal in response to the first and second values dependent on the time derivatives of the voltage and the current respectively, thereby generating a modulated control signal; and supplying the modulated control signal to a gate terminal of the gate-controlled switching device.

Thus it will be appreciated that aspects of the present disclosure provide an improved gate driver, an associated power converter, and a method of driving a gate-controlled switching device in which the respective rates of change of the current and voltage are used to modulate the control signal that is used to switch the gate-controlled switching device on and off. The rates of change of the voltage and current may, for example, be used to change the shape of the gate-source voltage change where the gate-controlled device comprises a transistor, as outlined below with respect to certain examples of the present disclosure.

Unlike systems known in the art per se that use the rate of change of the voltage and/or current to generate a control signal in a closed loop control system, a system in accordance with the principles outlined in this disclosure uses those measured rates of change (i.e. the magnitudes of the rates of change) to modulate an incoming control signal. Advantageously, this may place no special requirements on the alternating input signal, and the system may be readily employed within a conventional gate driver circuit without complex modification. Additionally, this may, for example, advantageously allow other parameters relating to the alternating input signal to be varied externally, e.g. the frequency, phase, and/or duty cycle of the input signal, thus changing the corresponding parameters of the signal ultimately applied to the gate of the gate-controlled switching device. These advantages may be achieved even with extremely high bandwidth.

Thus, advantageously, if it is desired to vary the control target for the rate of change of the voltage and/or current, no change is needed to the alternating input signal. That is, the incoming alternating input signal, which may be provided by an external signal generator, can be a consistent 'reference' signal from which the modulated signal applied to the gate of the gate-controlled switching device is derived. Any changes needed to drive the gate-controlled switching device can be effected by changing the modulation of the alternating input signal in response to the rates of change of the voltage and/or current as appropriate.

Those skilled in the art will appreciate that the modulated control signal alternates due to it being a modulated version of the alternating input signal. Generally, the alternating input signal is of a form such that it alternates between a high state and a low state. By high and low states, it will be understood that these refer to discrete signal levels, i.e. the alternating signal alternates between a logic high value (i.e. a digital '1') and a logic low value (i.e. a digital '0'). The logic high value may be a positive voltage while the logic low value may be a negative voltage or ground, though these are merely examples and other arrangements are envisioned, where the voltages associated with the logic states depends on the type of switching device in use.

There are a number of such signal forms known in the art per se. Generally, such signals are pulse waves, i.e. a non-sinusoidal waveform such as a rectangular waveform. Such signals may be, but are not necessarily, periodic. For example, a pulse train or a pulse frequency modulated (PFM) signal may be applied to the gate terminal of the switching device. However, in some examples, the alternating input signal is a pulse width modulated (PWM) signal.

The alternating input signal may be externally supplied, for example by an external signal generator and/or a controller. Such a signal generator may supply an alternating input signal such as a PWM signal at a particular frequency, magnitude, and duty cycle, as appropriate, where the magnitude of the signal is modulated by the gate driver as outlined hereinabove. However, in some examples, the gate driver comprises a signal generator arranged to generate the alternating input signal.

Generally, the principles of the present invention are particularly beneficial when applied to 'wide band gap' devices. The gate-controlled switching device is, at least in some examples, a transistor. In some examples, the gate-controlled switching device comprises a silicon carbide (SiC) transistor. However, in other examples, the switching device may be a fast switching metal-oxide-semiconductor field-effect-transistor (MOSFET).

The gate-controlled switching device may, in some examples, comprise a source terminal and a drain terminal. The gate-controlled switching device may comprise an enhancement mode or depletion mode device. In addition, the gate-controlled switching device may comprise an n-channel device or a p-channel device. In a preferred set of embodiments, the gate-controlled switching device comprises an n-channel enhancement mode device.

In some examples, the voltage applied across the gate-controlled switching device, the time derivative of which is determined by the voltage monitor circuit portion, may be a drain-source voltage of the gate-controlled switching device. In other words, the time derivative of the voltage between the drain and source terminals of the gate-controlled switching device may be used to modulate the signal applied to the gate terminal of the gate-controlled switching device.

In a potentially overlapping set of examples, the current through the gate-controlled switching device, the time derivative of which is determined by the current monitor circuit portion, may be a drain-source current of the gate-controlled switching device. In other words, the time derivative of the current between the drain and source terminals of the gate-controlled switching device may be used to modulate the signal applied to the gate terminal of the gate-controlled switching device.

The voltage monitor circuit portion may, at least in some examples, comprise an analogue filter. The voltage monitor circuit portion may comprise an operational amplifier (or 'op-amp') having a non-inverting input, an inverting input, and an output. In a set of examples, the non-inverting input of the op-amp is connected to the voltage across the gate-controlled switching device. In some such examples, the non-inverting input of the op-amp is connected to the voltage across the gate-controlled switching device via a resistive-capacitive (RC) network, wherein a first terminal of a resistor is connected to the non-inverting input of the op-amp, a second terminal of the resistor is connected to a first terminal of a capacitor at a node, and a second terminal of the capacitor is connected to the voltage across the gate-controlled switching device. Those skilled in the art will appreciate that the RC network forms an RC differentiator, i.e. the potential difference across the resistor is proportional to the time-rate of change of the voltage across the RC network.

The op-amp may therefore be configured as a non-inverting amplifier. The inverting input of the op-amp may, in some examples, be connected to the output of the op-amp via a resistive feedback network. The resistive feedback network may comprise a first feedback resistor connected between the output and inverting input of the op-amp, and a second feedback resistor connected between the inverting input and ground.

Thus, in a set of examples, the time derivative of the voltage across the gate-controlled switching device (dv/dt) charges the RC network, where the dv/dt of the gate-controlled switching device may be represented by the voltage across the resistor of the RC network as the first value. The arrangement of the op-amp and other resistors may form a signal modulating circuit that modulates the voltage across the resistor of the RC network to a voltage level suitable for the compensator. Additionally, noise may be filtered by such a circuit.

A further resistor may be connected between ground and the node between the resistor and capacitor.

In a further potentially overlapping set of examples, the voltage monitor circuit portion may comprise a transistor having a first terminal thereof connected to the node between the resistor and capacitor, a second terminal thereof connected to ground, and a gate terminal thereof connected to the alternating input signal. This transistor may, for example, comprise an n-channel enhancement mode device. The transistor of the voltage monitor circuit may be a metal-oxide-semiconductor field-effect-transistor (MOSFET). Such a MOSFET may be used to enable and disable the voltage monitor circuit portion in a flexible way.

Similarly, in some examples, the current monitor circuit portion may comprise an analogue filter. The current monitor circuit portion may comprise an op-amp having a non-inverting input, an inverting input, and an output. In a set of examples, the non-inverting input of the op-amp is arranged to receive a voltage that is dependent on a rate of change of the current through the gate-controlled switching device. This 'op-amp' may be referred to as a 'second' or 'further' op-amp in a set of examples in which both voltage and current monitor circuit portions with an op-amp are present.

In some such examples, the non-inverting input of the op-amp is connected to a terminal of the gate-controlled switching device via a resistive-capacitive (RC) ladder network. In some such examples, the RC ladder network comprises a plurality of resistors and a plurality of capacitors, wherein the plurality of resistors are connected in series between the gate-controlled switching device and the non-inverting input of the op-amp, and wherein the plurality of capacitors are connected such that a first terminal of each capacitor is connected to a node between a pair of adjacent resistors, and such that a second terminal of each capacitor is connected to ground. In addition to converting the current to a voltage suitable for input to an op-amp, the RC ladder network also acts as an RC differentiator. As the RC ladder network provides a time-differential of the voltage applied to it, this is a proxy for the time-differential of the current through the gate-controlled switching device.

The op-amp may therefore be configured as a non-inverting amplifier. The inverting input of the op-amp may, in some examples, be connected to the output of the op-amp via a resistive feedback network. The resistive feedback network may comprise a first feedback resistor connected between the output and inverting input of the op-amp, and a second feedback resistor connected between the inverting input and ground. These 'first' and 'second' feedback resistors may be referred to as 'third' and 'fourth' feedback resistors in a set of examples in which both voltage and current monitor circuit portions with a non-inverting amplifier based op-amp circuit are present.

The RC ladder network may be connected to a terminal of the gate-controlled switching device, and may be connected to the source terminal of said device. This connection may be direct, however in some examples the RC ladder network is connected to the terminal of the gate-controlled switching device via an inductor. This inductor may, in some examples, be a parasitic inductance, e.g. a parasitic inductance inside the gate-controlled switching device.

Thus, in a set of examples, the time derivative of the current through the gate-controlled switching device (di/dt) may result in a voltage drop across the parasitic inductance inside the gate-controlled switching device. The RC network may measure the voltage drop across the parasitic inductance, where this voltage drop is representative of the di/dt for the gate-controlled switching device. The voltage across the capacitor connected to the op-amp's non-inverting input may be modulated by the resistive feedback circuit and op-amp in order to change the signal to a voltage level suitable for the compensator and to filter noise.

In some examples, the compensator comprises an analogue controller. In a set of such examples, the analogue controller comprises a summing amplifier arranged to receive the alternating input signal and the time derivatives of the voltage and current and to produce the modulated control signal at an output thereof. Those skilled in the art will appreciate that a summing amplifier is an op-amp configuration in which a plurality of input voltages are summed together at a common node. Generally, each input voltage is connected to the node via a respective resistor. The common node may be connected to a non-inverting input of an op-amp, for example a relatively high bandwidth op-amp. The inverting input of the op-amp may be connected to ground, e.g. via a further resistor.

A summing amplifier may generally employ feedback, and thus in some examples the summing amplifier comprises a feedback circuit portion between the output of the summing amplifier and the inverting input of the amplifier. The feedback circuit portion may comprise a RC network. In some examples, the RC network comprises a resistor and a first capacitor connected in series, and a second capacitor connected in parallel to the resistor and the first capacitor. In other words, a high order low pass filter may be used in the feedback path.

It will be appreciated that the roles of the non-inverting and inverting inputs could be reversed.

In some alternative examples, the compensator comprises a digital controller. The digital controller may, in some examples, comprise a complex programmable logic device (CPLD) or field-programmable gate array (FPGA) device. In a set of potentially overlapping examples, the digital controller may comprise a voltage level shifter. The digital controller may, in some examples, receive the alternating input signal and the time derivatives of the voltage and current, wherein the digital controller varies the magnitude of the modulated control between a plurality of voltage levels depending on respective values of the time derivatives of the voltage and current.

In some examples, the gate driver circuit comprises a push-pull circuit portion, said push-pull circuit portion comprising a push-pull pair of transistors arranged such that their respective base terminals are connected to the output of the compensator. The push-pull circuit portion may, in some examples, be constructed from a pair of bipolar junction transistors (BJTs) arranged in series. While in such examples BJTs are used, other arrangements are envisaged, for example in which N- and P-type MOSFETS and/or an integrated circuit (IC) implemented push-pull circuit is used to form the push-pull circuit portion instead.

In some examples, the push-pull circuit portion comprises a PNP BJT and an NPN BJT, arranged such that: a collector terminal of the PNP BJT is connected to a positive drive supply voltage; a collector terminal of the NPN BJT is connected to a negative drive supply voltage; an emitter terminal of the PNP BJT is connected to an emitter terminal of the NPN BJT, wherein said emitter terminals are further connected to the gate terminal of the gate-controlled switching device; and a base terminal PNP BJT is connected to a base terminal of the NPN BJT, wherein said base terminals are further connected to the output of the compensator.

The emitter terminal of the PNP BJT may, in some examples, be connected to the gate terminal of the gate-controlled switching device via a first gate resistor. In a set of potentially overlapping examples, the emitter terminal of the NPN BJT may be connected to the gate terminal of the gate-controlled switching device via a second gate resistor.

In some examples, the gate driver circuit comprises a plurality of push-pull circuit portions, where each push-pull circuit portion may be identical, though they may be different in some arrangements. The provision of multiple push-pull units in parallel may help to avoid fidelity loss of the gate signal in some arrangements. The number of push-pull circuit portions employed may depend on the power rating of the gate-controlled switching device.

It will be appreciated that each 'capacitor' may, in some examples, be a plurality of capacitors in series in order to meet high voltage requirements if necessary. Similarly, each 'resistor' may, in some examples, be a plurality of resistors in series in order to meet high voltage requirements if necessary.

BRIEF DESCRIPTION OF THE DRAWINGS

Certain examples of the present disclosure will now be described with reference to the accompanying drawings, in which:

FIGS. 7A-D are graphs illustrating operation of the gate driver circuit of FIG. 4;

DETAILED DESCRIPTION

Figure 1:
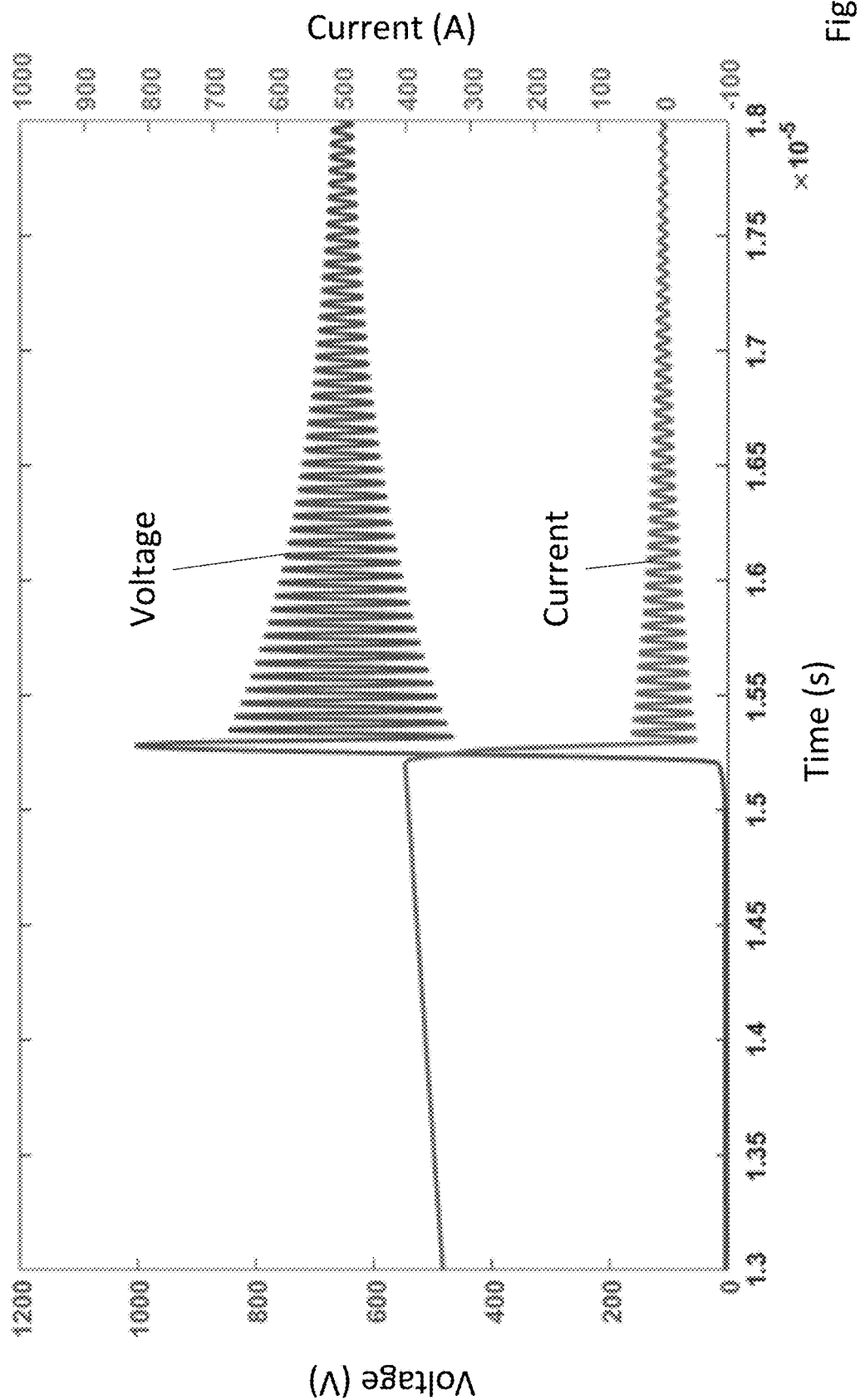
FIG. 1 is a graph showing voltage and current ringing in a prior art gate driver circuit arrangements.

FIG. 1 is a graph showing voltage and current ringing in a prior art gate driver circuit arrangements. Specifically, FIG. 1 provides a graph of the current (right-hand y-axis) and voltage (left-hand y-axis) against time (x-axis) for a typical SiC device. As can be seen from the graph, following switching of the SiC (i.e. between the on- and off-states), both the current and voltage exhibit significant oscillations. This is referred to as 'ringing'.

Figure 2:
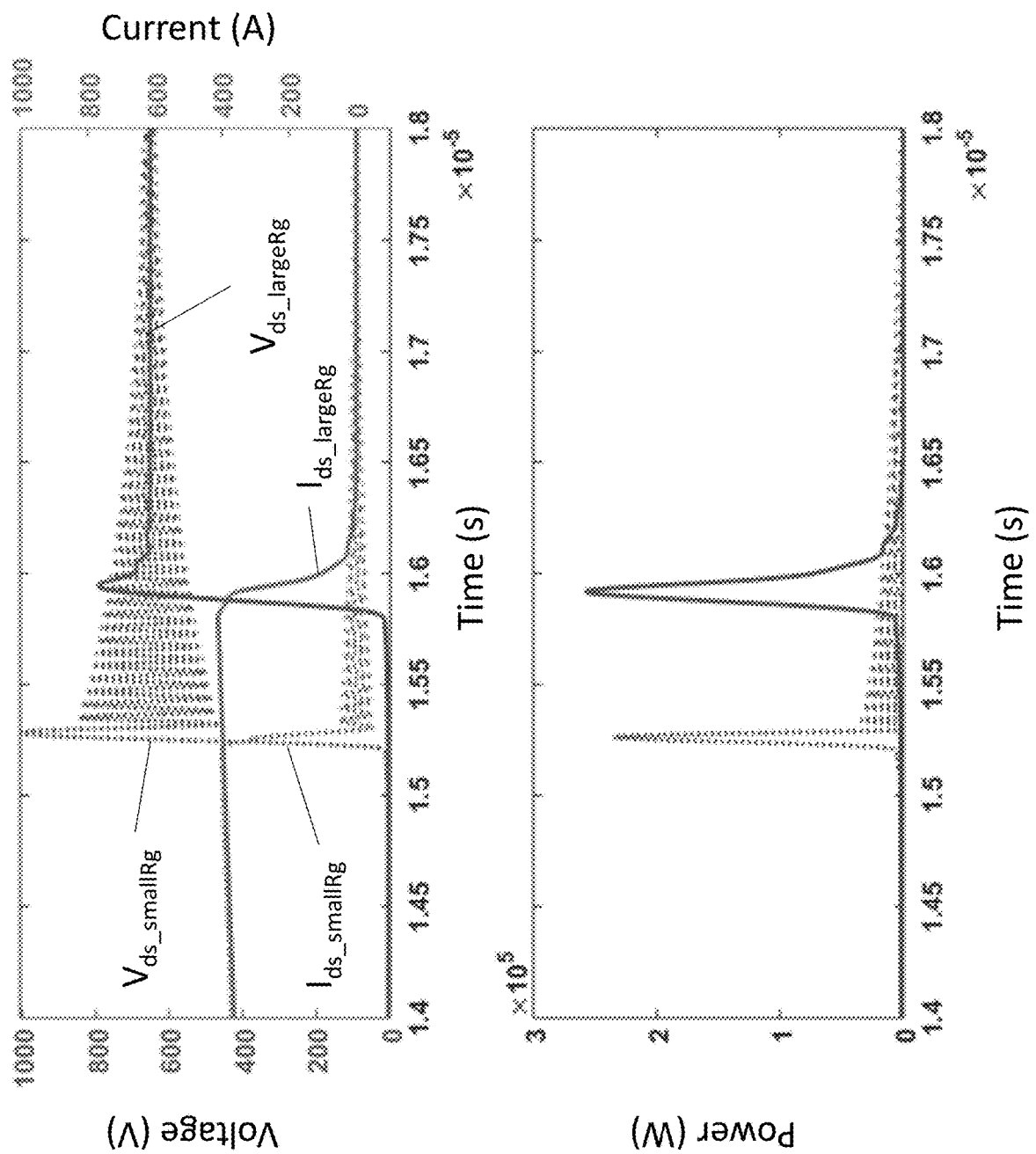
FIG. 2 is a graph showing a comparison of prior art gate driver circuit arrangements.

FIG. 2 is a graph showing a comparison of prior art gate driver circuit arrangements. So as to suppress the voltage/current ringing shown in FIG. 1, a large resistance Rg may be presented at the gate of the transistor. A comparison is shown between the drain-source voltage Vds_smallRg and drain-source current Ids_smallRg without the large gate resistance compensation (i.e. the prior art system described with reference to FIG. 1) and the drain-source voltage Vds_largeRg and drain-source current Vds_largeRg with the prior art large gate resistance compensation.

FIG. 2 also shows the power consumption of the two different devices. For ease of illustration, the large gate resistance plots are shown as solid lines, while the small gate resistance plots are shown as dashed lines.

As can be seen in FIG. 2, the introduction of the large gate resistance Rg reduces the degree of ringing exhibited by the system when the SiC device switches. However, the use of such a large gate resistance Rg results in much higher switching losses for the devices, which can be seen from the higher power consumption spike, and importantly the increased energy consumption, i.e. the time-integral of the power (the area under the graph of the power plot).

Figure 3A:
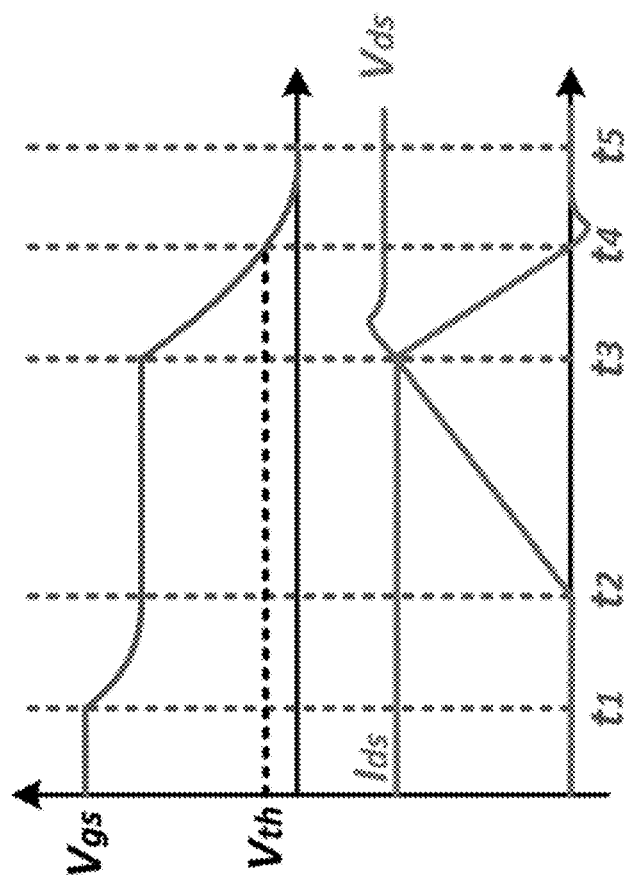
FIGS. 3A and 3B are further graphs showing a comparison of prior art gate driver circuit arrangements.
Figure 3B:
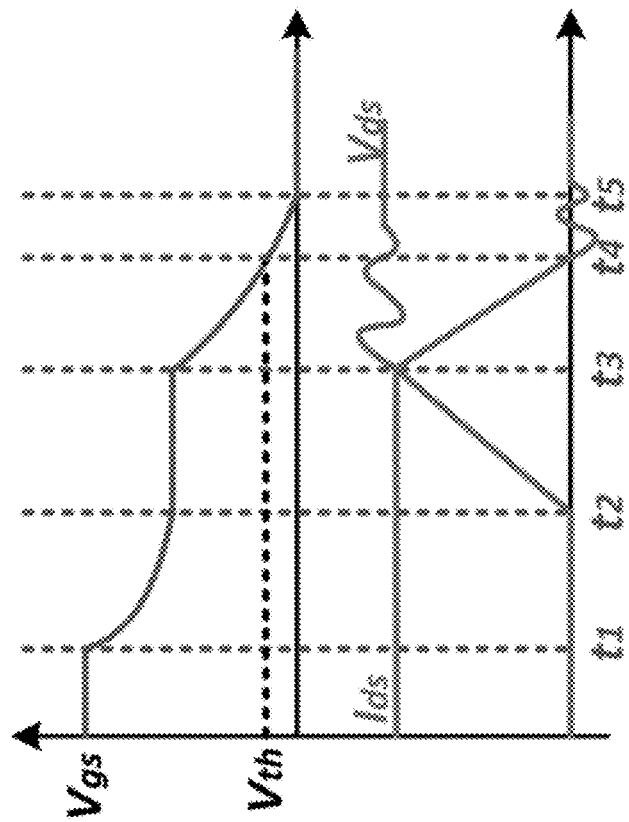

FIGS. 3A and 3B are further graphs showing a comparison of prior art gate driver circuit arrangements. Firstly, the turn off process is shown in FIG. 3A, i.e. without the large gate resistance Rg.

When the turn off PWM (i.e. when the alternating input signal goes low) is sent to the SiC device, Vgs starts to decrease at t1. At time t2, the gate-source voltage Vgs voltage enters Miller Plateau and as a result the drain-source voltage Vds starts to increase. At time t3, the drain-source current Ids through the SiC device starts decreasing and reaches zero when the gate-source voltage Vgs hits the threshold voltage Vth at t4. Due to the characteristics of SiC devices, voltage and current ringing is observed between t3 and t4.

With regard to the 'turn-off energy' for the same SiC device, the time-rate of change of the voltage dv/dt is dominant between t2 and t3, the time-rate of change of the current di/dt value is dominant between t3 and t4, and the oscillation in the time interval is dominant between t4 and t5 will dominate. This is derived approximately as per Equation 1 below:

$$E_{turnoff} = \int_{t2}^{t3} I_{ds} V_{ds}(t) \cdot dt + \int_{t3}^{t4} I_{ds}(t) V_{ds} \cdot dt \approx \frac{1}{2} V_{ds} I_{ds}(t3 - t2) + \frac{1}{2} V_{ds} I_{ds}(t4 - t3)$$

Equation 1: Turning Off Energy $E_{turnoff}$

During the period between t1 and t2, the drain-source voltage Vds is zero and so there is substantially no energy consumption during that time. Furthermore, during the period between t4 and t5, the drain-source current Ids oscillates about zero, and averages to approximately zero in that time and is considered negligible.

Figure 4:
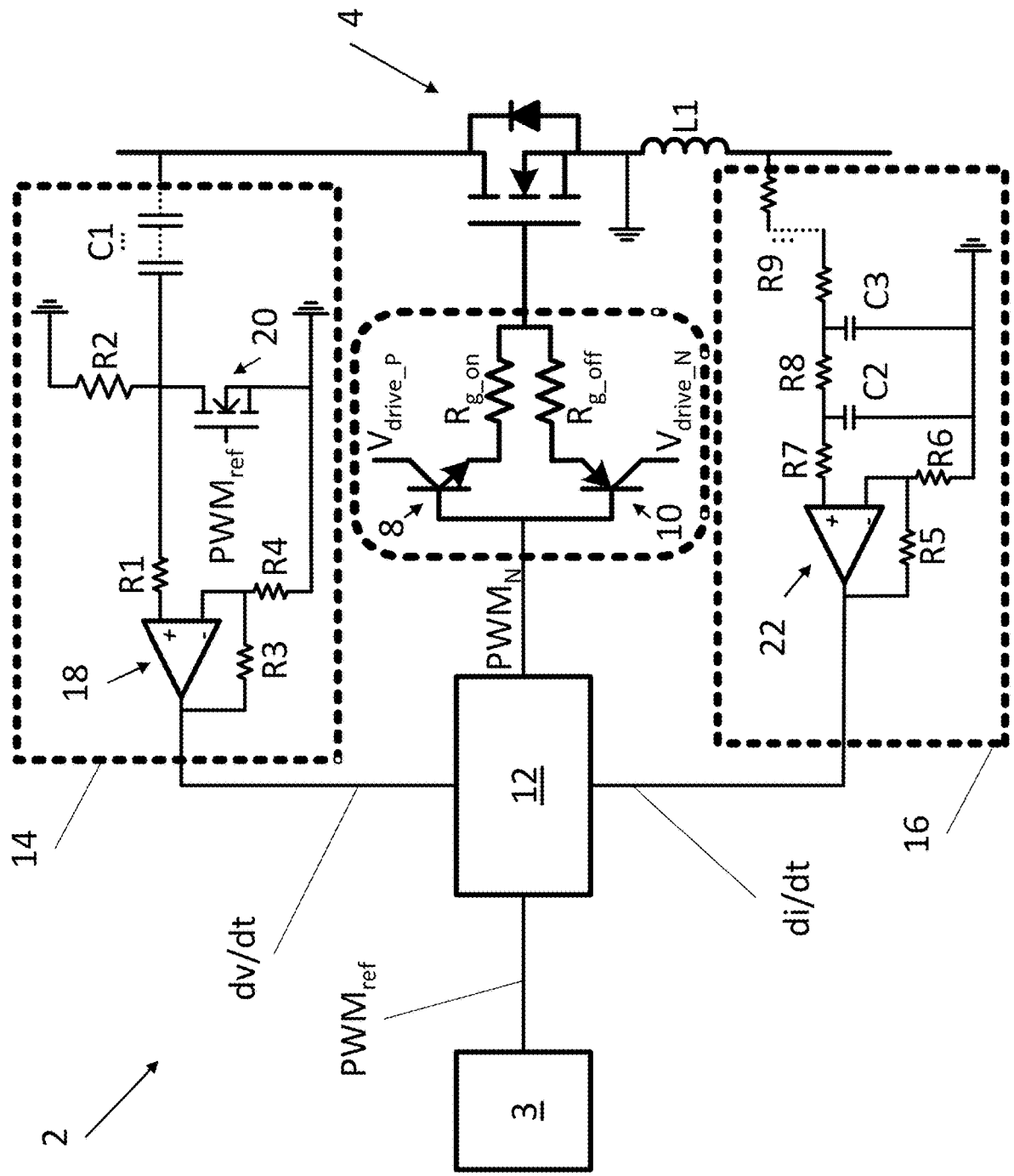
FIG. 4 is a circuit diagram of a gate driver circuit in accordance with an example of the present disclosure.

FIG. 4 is a circuit diagram of a gate driver circuit 2 in accordance with an example of the present disclosure. The gate driver circuit 2 is arranged to drive the gate of a SiC device 4, which is shown here for illustrative purposes, but does not form part of the gate driver circuit per se. The SiC device 4 is an n-channel enhancement mode transistor.

A signal generator 3 is arranged to supply a PWM reference signal PWMref, described in further detail below. This signal generator 3 forms part of the gate driver circuit 2 in this illustrative example, but may be external to the rest of the circuit 2 in other examples.

The gate driver circuit 2 comprises a push-pull circuit portion 6, which is constructed from a push-pull pair of BJTs 8, 10. The PNP BJT 8 and NPN BJT 10 are arranged such that their respective base terminals are connected together. These base terminals are connected to a compensator 12, the details of which are described in further detail below.

Figure 11:
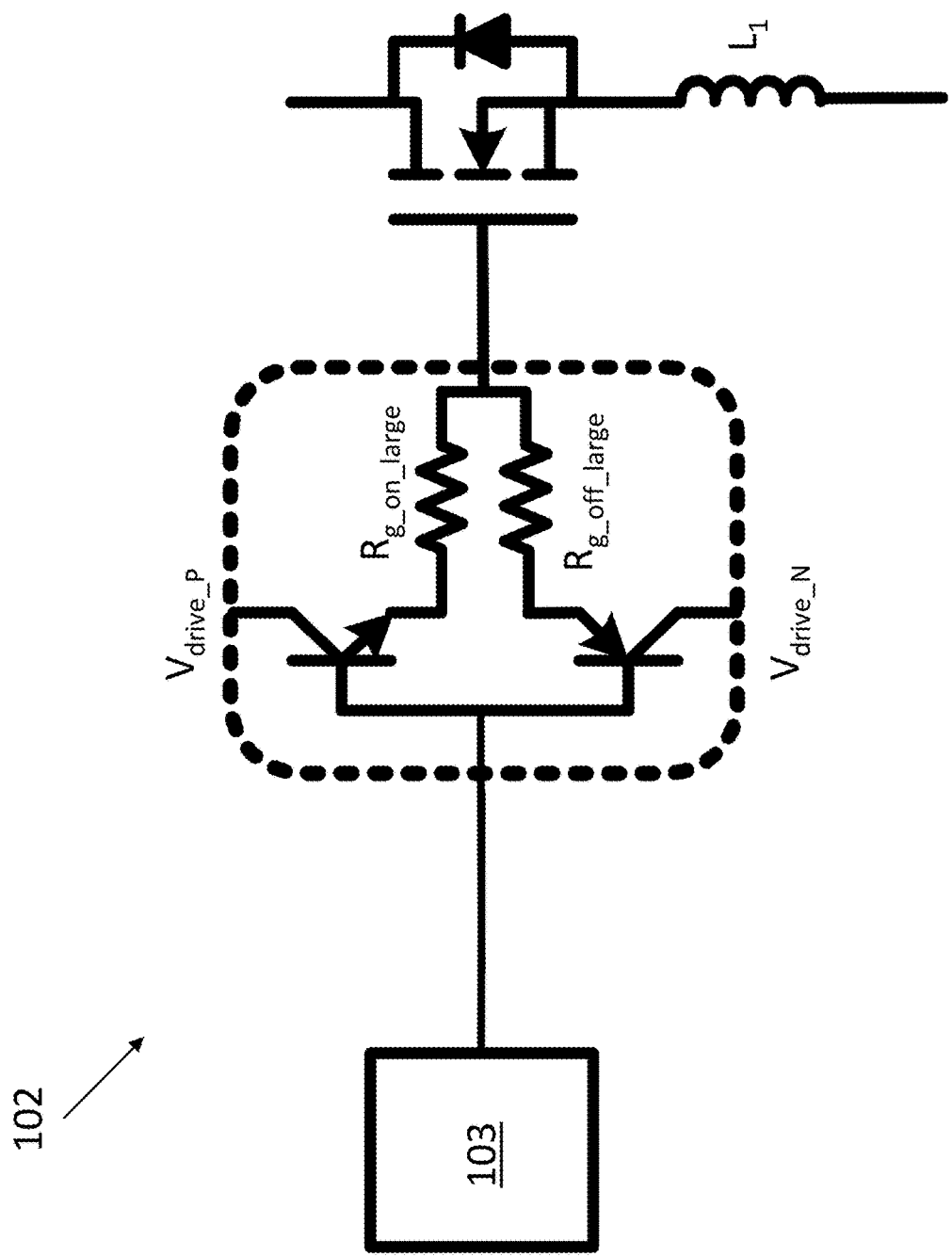
FIG. 11 is a circuit diagram of a conventional gate driver circuit.

The emitter terminals of these BJTs 8, 10 are connected together via respective gate resistors Rg_on, Rg_off, where a node between these resistors Rg_on, Rg_off is connected to the gate terminal of the SiC device 4. The collector terminal of the PNP BJT 8 is connected to a positive drive supply voltage Vdrive_P and the collector terminal of the NPN BJT 10 is connected to a negative drive supply voltage Vdrive_N. The resistances of these resistors Rg_on, Rg_off may be significantly less than the respective resistances of the large gate resistors Rg_on_large, Rg_off_large used in the conventional driver circuit of FIG. 11 described previously.

There may be multiple 'units' (or 'cells') of the push-pull circuit portion 6 arranged in parallel may help to avoid fidelity loss of the gate signal in some arrangements. The number of push-pull circuit portions employed may depend on the power rating of the gate-controlled switching device. These may be identical (i.e. using the same resistances and devices), or they may be different, as appropriate to design specification.

The gate driver circuit 2 also comprises a voltage monitor circuit portion 14 arranged to produce a value that depends on the time derivative of the voltage across the SiC device 4, and a current monitor circuit portion 16 arranged to produce a value that depends on the time derivative of the current through the SiC device 4.

The voltage monitor circuit portion 14 includes an op-amp 18 having a non-inverting input, an inverting input, and an output. The non-inverting input of the op-amp 18 is connected to the drain terminal of the SiC device 4, such that the drain-source voltage Vds across the SiC device 4 is input to the op-amp 18. The non-inverting input of the op-amp 18 is connected to the drain-source voltage Vds across the SiC device 4 via an RC network, as outlined below.

A resistor R1 is connected to the non-inverting input of the op-amp 18 and a capacitor C1 is connected to the other side of the resistor R1 at a node. The capacitor C1 may be constructed from a plurality of capacitors connected in series, e.g. to satisfy high voltage requirements, as illustrated by the capacitor connected via dashed lines. The other side of the capacitor C1 is connected to the drain-source voltage Vds across the SiC device 4. This RC network forms an RC differentiator, i.e. the potential difference across the resistor is proportional to the time-rate of change of the voltage across the RC network. A further resistor R2 is connected between ground and the node between the resistor R1 and capacitor C1 that form the RC differentiator. Thus, due to this RC differentiator, the output of the op-amp 18 is proportional to the time-differential of the drain-source voltage Vds across the SiC device 4. For ease of reference, this time-differential is referred to hereafter as 'dv/dt'.

The op-amp 18 is configured as a non-inverting amplifier, where the inverting input of the op-amp 18 is connected to the output of the op-amp 18 via a resistive feedback network constructed from a pair of feedback resistors R3, R4. The first feedback resistor R3 is connected between the output and inverting input of the op-amp 18, and the second feedback resistor R4 is connected between the inverting input and ground. Thus the gain $A_{G1}$ of the non-inverting amplifier including the op-amp 18 is given by Equation 2 below:

$$A_{G1} = 1 + \frac{R3}{R4}$$

Equation 2: Gain of Non-Inverting Amplifier of the Voltage Monitoring Circuit Portion 14 Including Op-Amp 18

The voltage monitor circuit portion 14 also includes a transistor 20 having its drain terminal connected to the node between the resistor R1 and capacitor C1. The source terminal of the transistor 20 is connected to ground, and the gate terminal thereof connected to the alternating input signal, i.e. the PWM reference signal PWMref that is input to the compensator 12. This transistor 20 comprises an n-channel enhancement mode device.

The current monitor circuit portion 16 includes an op-amp 22 having a non-inverting input, an inverting input, and an output. The non-inverting input of the op-amp 22 is connected to the source terminal of the SiC device 4 via a resistor R7 which is connected to the non-inverting input of the op-amp 22, this resistor R7 being further connected to an RC ladder network at outlined below. Due to this arrangement, the drain-source current $I_{ds}$ through the SiC device 4 is input to the op-amp 18 via an RC ladder network (described below) which converts this current $I_{ds}$ to a voltage suitable for input to the op-amp 22. This RC ladder network also acts as a differentiator, such that the output of the op-amp 22 is proportional to the time-differential of the drain-source current $I_{ds}$ through the SiC device 4. For ease of reference, this time-differential is referred to hereafter as 'di/dt'.

The op-amp 22 is configured as a non-inverting amplifier, similarly to the op-amp 18 of the voltage monitor circuit portion 14. The inverting input of the op-amp 22 is connected to the output of the op-amp via a resistive feedback network constructed from a pair of feedback resistors R5, R6. The gain $A_{G2}$ of the non-inverting amplifier including the op-amp 22 is given by Equation 3 below:

$$A_{G2} = 1 + \frac{R5}{R6}$$

Equation 3: Gain of Non-Inverting Amplifier of the Current Monitoring Circuit Portion 16 Including Op-Amp 22

The RC ladder network comprises two resistors R8, R9 and two capacitors C2, C3. The resistor R9 may be constructed from a series of resistors (as shown by the dashed line), e.g. in order to meet high voltage requirements. The resistors are connected in series between parasitic inductance L1 of the SiC device 4, and the non-inverting input of the op-amp 22. It will be appreciated that the parasitic inductance L1 is generally not a discrete component, but rather an intrinsic effect of the SiC device 4, but is shown as a component in FIG. 4 for illustrative purposes.

The capacitors C2, C3 are connected such that a first terminal of each capacitor C2, C3 is connected to a node between a pair of adjacent resistors R7, R8, R9, and such that a second terminal of each capacitor C2, C3 is connected to ground. Specifically, one capacitor C2 is connected between one pair of resistors R7, R8 while the other capacitor C3 is connected between another pair of resistors R8, R9.

In general, the RC ladder network may be constructed from a suitable number of resistors and capacitors in accordance with design requirements.

Figure 5:
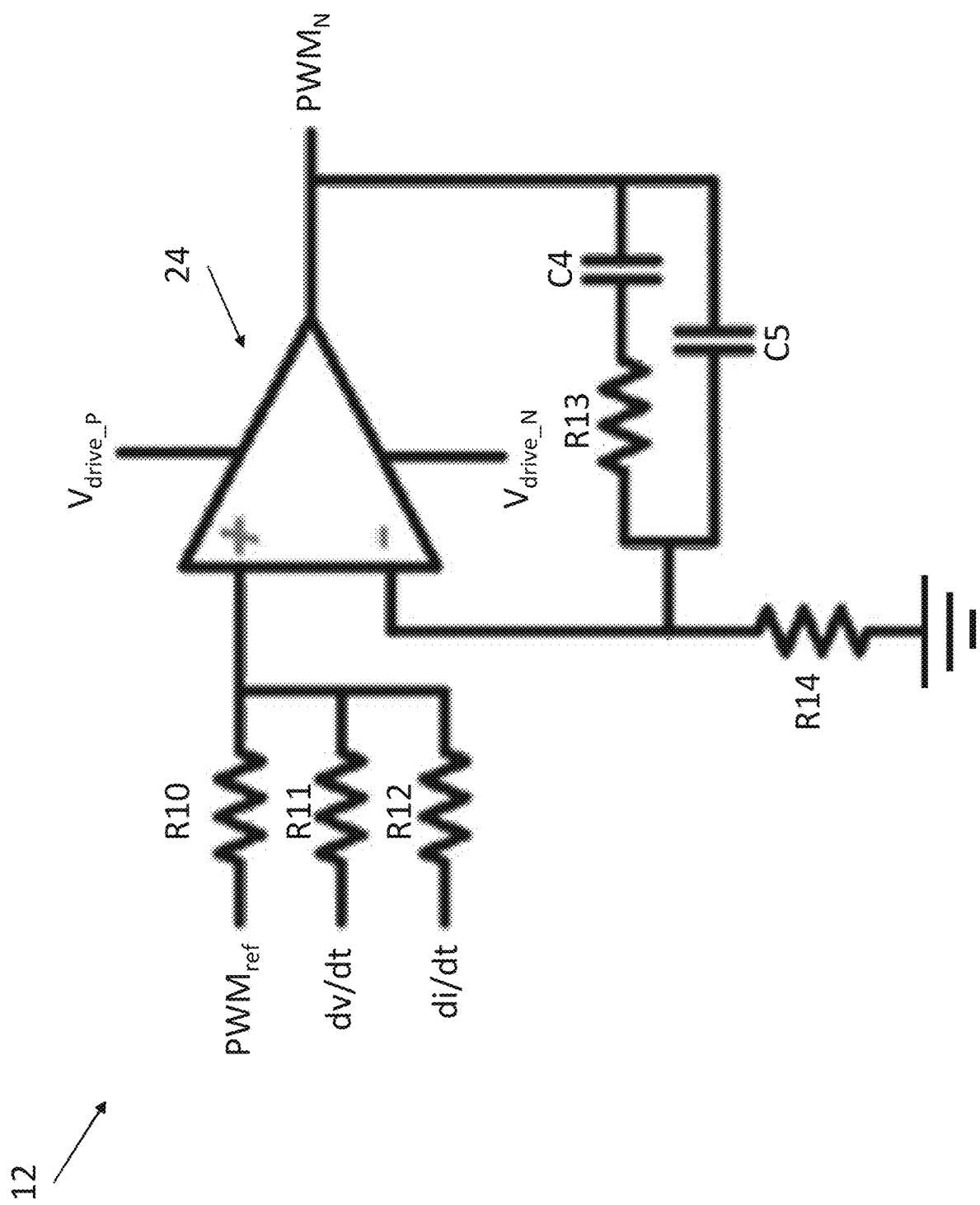
FIG. 5 is a circuit diagram of a compensator arranged for use with the gate driver circuit of FIG. 4.

FIG. 5 is a circuit diagram of a compensator 12 arranged for use with the gate driver circuit 2 of FIG. 4. This analogue compensator 12 uses a summing amplifier topology including an op-amp 24.

The non-inverting input of the op-amp 24 is arranged to receive the reference PWM signal PWMref, the time-derivative dv/dt of the drain-source voltage Vds across the SiC device 4 determined by the voltage monitor circuit portion 14, and the time-derivative di/dt of the drain-source current Ids across the SiC device 4 determined by the current monitor circuit portion 16. These three voltages are summed at the non-inverting input of the op-amp 24. Depending on the resistances of the resistors R10, R11, R12, this may be a weighted sum as is known in the art per se.

The op-amp 24 is provided with feedback via a high order low pass filter constructed from a further resistor R13 and capacitor C4 in parallel with an additional capacitor C5. This filter is connected between the inverting input and output of the op-amp 24. Another resistor R14 is connected between the inverting input of the op-amp 24 and ground.

The op-amp 24 produces a modulated output signal PWMN, which is supplied to the push-pull portion 6, which in turn drives the gate terminal of the SiC device 4. This modulated output signal PWMN therefore depends on the rates of change of the drain-source voltage Vds and current Ids.

Figure 6:
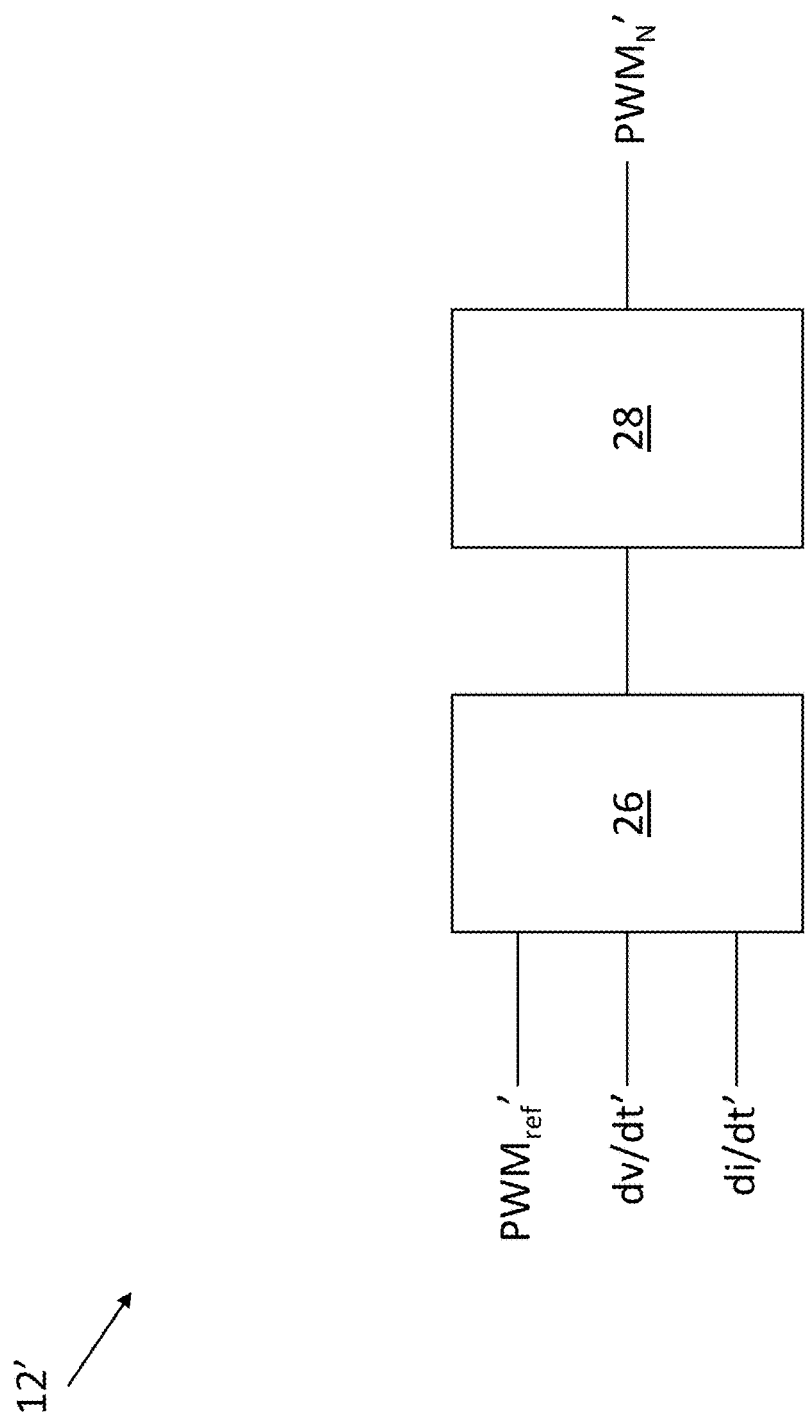
FIG. 6 is a circuit diagram of an alternative compensator arranged for use with the gate driver circuit of FIG. 4.

FIG. 6 is a circuit diagram of an alternative compensator 12' arranged for use with the gate driver circuit 2 of FIG. 4. For ease of reference, elements and signals corresponding to those described previously are given corresponding labels, appended with a prime symbol (') to denote that these relate to a further example of the present disclosure.

The compensator 12' of FIG. 6 is constructed from a digital controller 26 (e.g. a CPLD or FPGA) and a voltage level shifter 28. The digital controller 26 receives the PWM reference signal PWMref' (i.e. the alternating input signal) and the time derivatives of the voltage and current, dv/dt' and di/dt' respectively.

The digital controller 26 provides a signal to the voltage level shifter 28 that depends on respective values of the time derivatives of the voltage and current, dv/dt and di/dt respectively. In response, the voltage level shifter 28 varies the magnitude of the modulated control signal PWMN' between a plurality of voltage levels.

The modulated control signal PWMN' is supplied to the push-pull portion 6, which in turn drives the gate terminal of the SiC device 4. This modulated output signal PWMN' therefore depends on the rates of change of the drain-source voltage Vds and current Ids.

FIGS. 7A-D are graphs illustrating operation of the gate driver circuit of FIG. 4.

In FIG. 7A, it can be seen that the gate-source voltage Vgs of the SiC device 4 undergoes a relatively fast decrease before t2. Due to the high rate of change dv/dt of the drain-source voltage Vds, the time interval between t2 and t3 is reduced compared to prior art arrangements.

By utilising the rates of change dv/dt and di/dt as feedback during turn off of the SiC device 4, a Vgs ramp up is created as shown in FIG. 7A, which results in a slower rate of change of the drain-source current Ids, i.e. a smaller di/dt.

This smaller di/dt attenuates the ringing of the drain-source voltage Vds. After the gate-source voltage Vgs ramps up, the gate-source voltage Vgs starts to decrease with a high rate of change of the drain-source current Ids, i.e. a high di/dt. This will not only help to reduce the time interval between t3 and t4, but also to compensate the extra loss due to lower di/dt brought by the ramp up of the gate-source voltage Vgs. A simulated result is presented in FIG. 7B, which is well matched with the theoretical analysis shown in FIG. 7A.

Similar performance for turning on process is shown in FIG. 7C which shows the theoretical analysis while the well-matched simulated result is shown in FIG. 7D.

Figure 8:
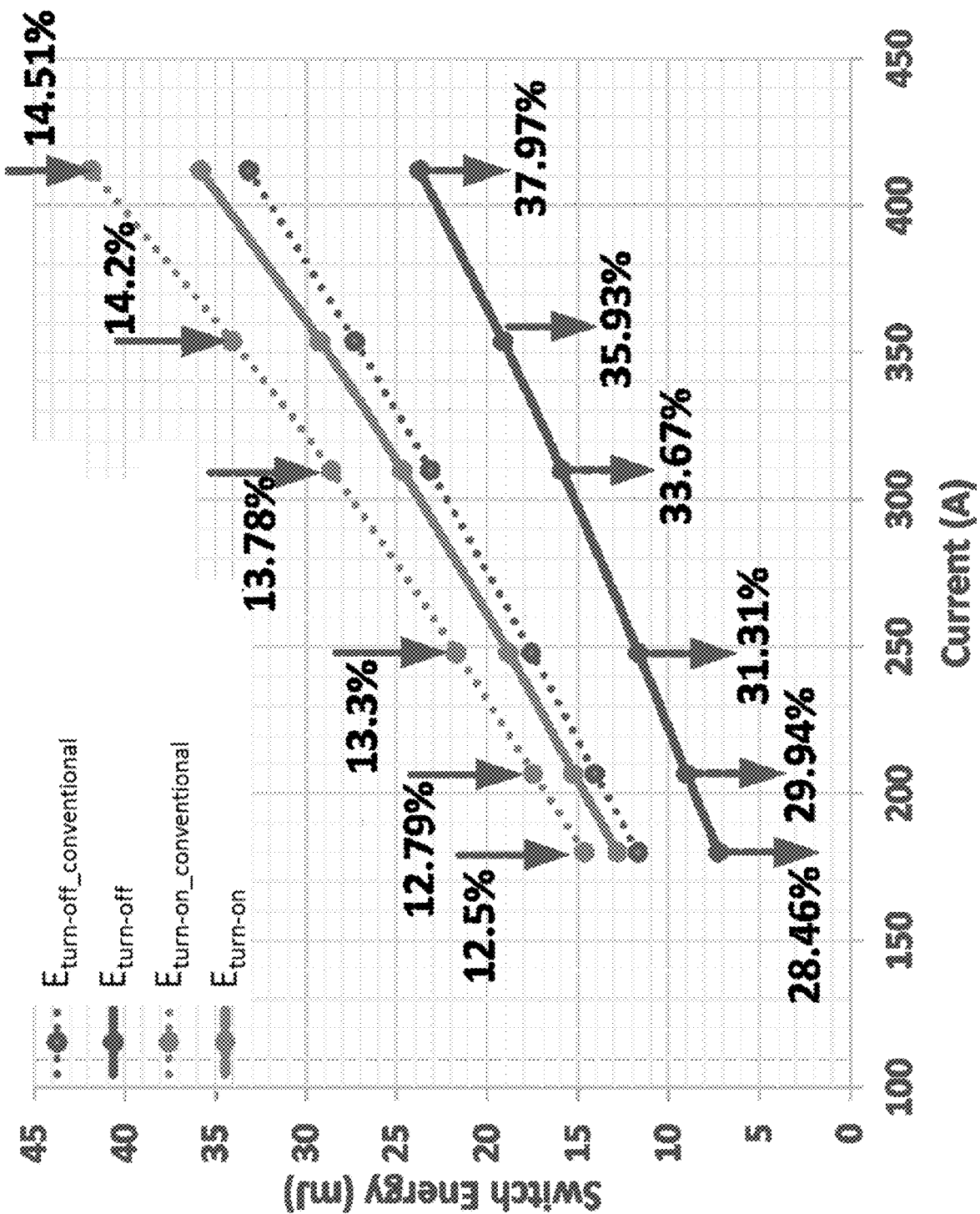
FIG. 8 is a graph showing a performance comparison between a prior art gate driver circuit and the gate driver circuit of FIG. 4.

FIG. 8 is a graph showing a performance comparison between a prior art gate driver circuit and the gate driver circuit 2 of FIG. 4. Specifically, FIG. 8 shows a comparison of the turn-off energy Eturn-off associated with the gate driver circuit 2 of FIG. 4 (shown as a solid line) to the turn-off energy Eturn-off_conventional associated with a prior gate driver circuit (shown as a dashed line). FIG. 8 also shows a comparison of the turn-on energy (shown as a solid line) Eturn-on associated with the gate driver circuit 2 of FIG. 4 to the turn-on energy Eturn-on_conventional associated with the prior gate driver circuit (shown as a dashed line).

As can be seen from FIG. 8, there are significant reductions in the energy required to switch the SiC device 4 when using the gate driver circuit 2 of FIG. 4 compared to the prior art gate driver. The energy savings generally increase with increased current. These energy savings are particularly pronounced with respect to the turn-off energy Eturn-off, but savings are also significant for the turn-on energy Eturn-on.

Figure 9:
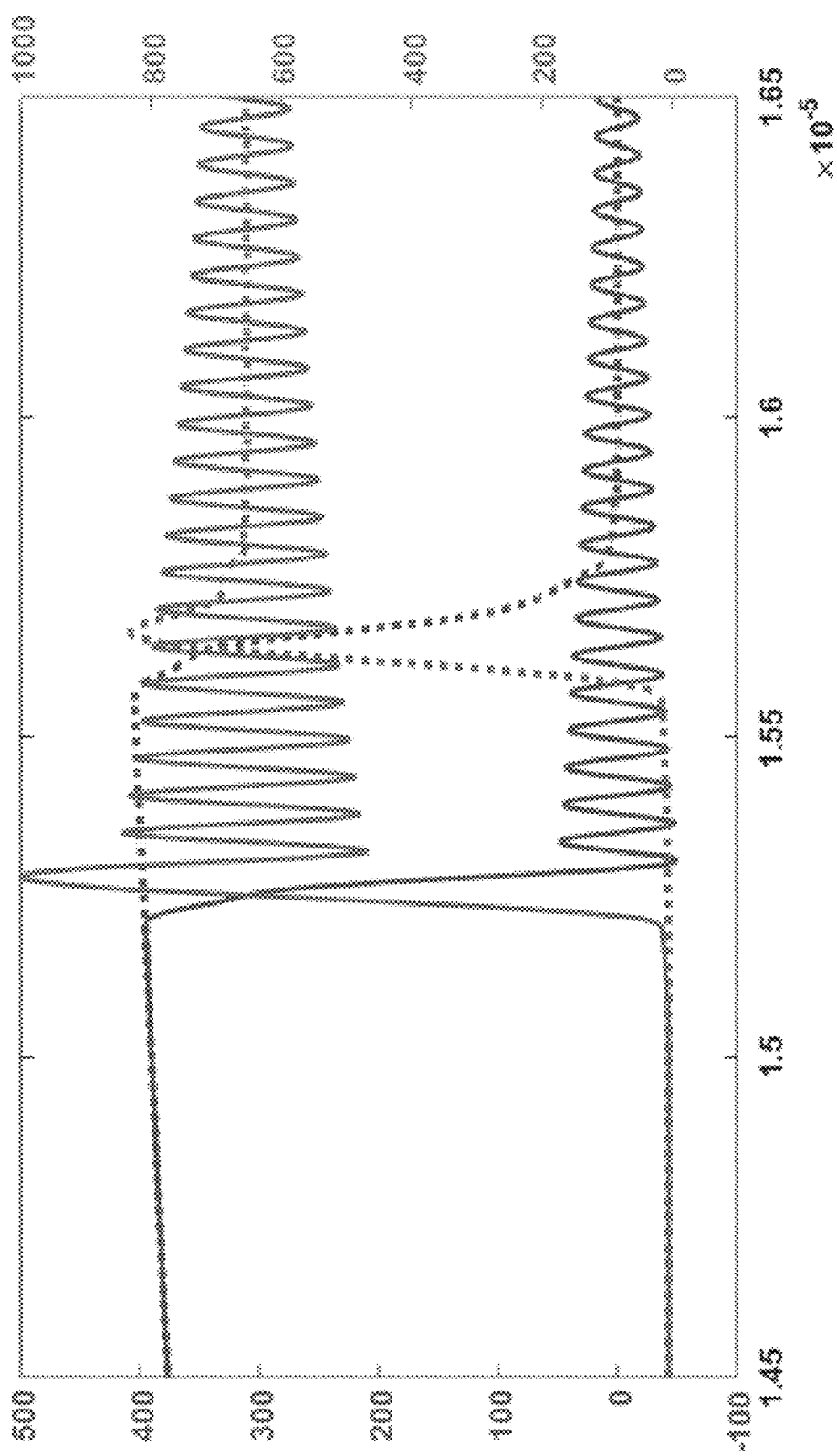
FIG. 9 is a graph showing a further performance comparison between a prior art gate driver circuit and the gate driver circuit of FIG. 4.

FIG. 9 is a graph showing a further performance comparison between a prior art gate driver circuit and the gate driver circuit 2 of FIG. 4.

Along with reducing the switching losses, the gate driver circuit 2 in accordance with an example of the present disclosure also contributes to the reduction of voltage and current ringing, which in turn helps the system to have an enhanced EMI (i.e. noise) performance.

FIGS. 10A-D are further graphs illustrating performance of the gate driver circuit of FIG. 4. The gate driver circuit 2 offers the possibility to control the dv/dt as shown in FIGS. 10A-D. The parameters in the compensator 12 shown in FIG. 4 can be changed, e.g. in order to achieve different dv/dt performance.

Figure 10A:
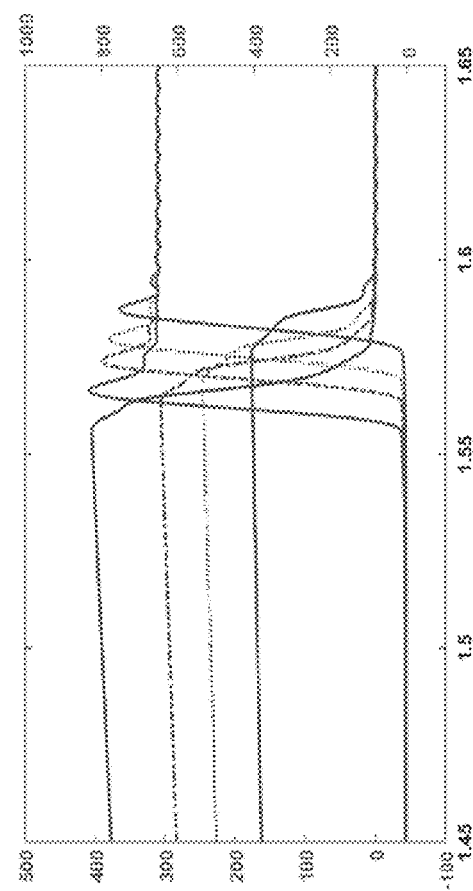
FIGS. 10A-D are further graphs illustrating performance of the gate driver circuit of FIG. 4.

In FIG. 10A, the impact of different compensator parameters on the dv/dt performance can be observed. The dv/dt slope changes from 7.75 V/ns to 17.38V/ns according to those variable parameters.

Figure 10B:
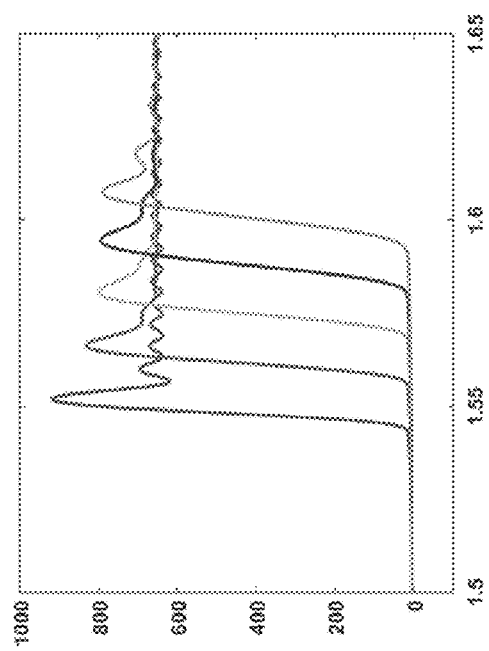

FIG. 10B shows the dv/dt controllability for the case of 13.37 V/ns at different current levels. It can be seen that the dv/dt is kept constant with different current values.

Figure 10C:
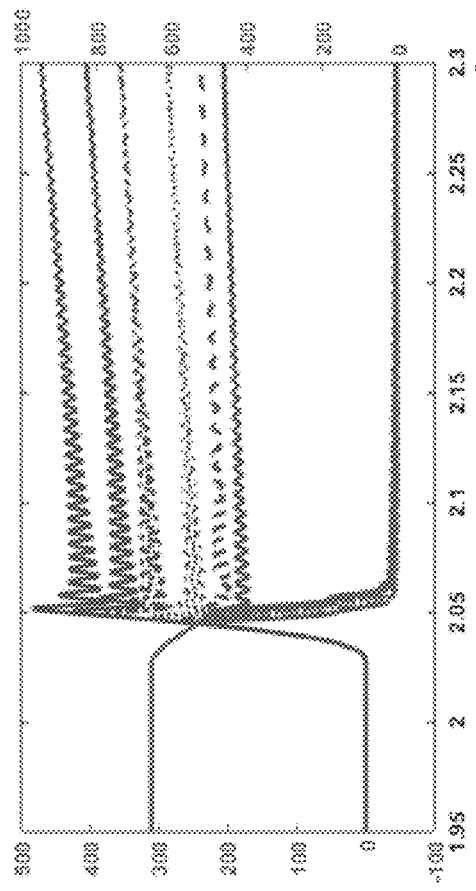
Figure 10D:
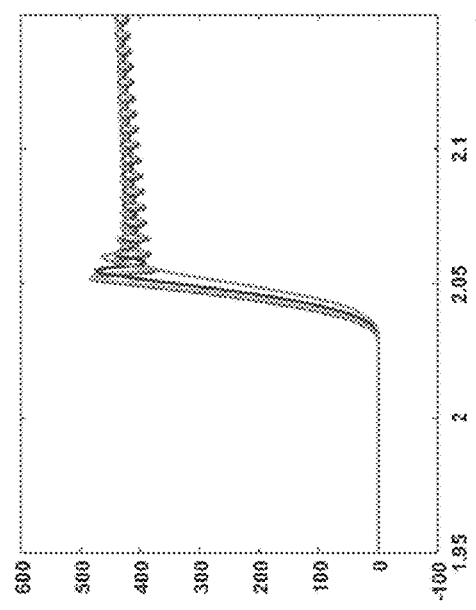

With respect to the turn-on performance, the results are shown in FIG. 10C and FIG. 10D. In this way, a gate driver circuit in accordance with the principles outlined herein may provide the capability of controlling the system EMI performance.

Thus it will be appreciated by those skilled in the art that examples of the present disclosure provide an improved gate driver that uses the rates of change of the voltage and current to modulate a control signal applied to the gate terminal of a gate-controlled device, e.g. a SiC transistor. While specific examples of the disclosure have been described in detail, it will be appreciated by those skilled in the art that the examples described in detail are not limiting on the scope of the disclosure.

The invention claimed is:

1. A gate driver circuit for driving a gate-controlled switching device, the gate driver circuit comprising:
a voltage monitor circuit portion arranged to produce a first value that is dependent on a time derivative of a voltage applied across the gate-controlled switching device;
a current monitor circuit portion arranged to produce a second value that is dependent on a time derivative of a current through the gate-controlled switching device;
a compensator arranged to receive an alternating input signal, the first value that is dependent on the time derivative of the voltage, and the second value that is dependent on the time derivative of the current, wherein the compensator is arranged to modulate a magnitude and transition profile of the alternating input signal in response to the respective time derivatives of the voltage and the current, thereby generating a modulated control signal;
wherein the gate driver circuit is arranged to supply the modulated control signal to a gate terminal of the gate-controlled switching device;
wherein the voltage monitor circuit portion comprises an op-amp having a non-inverting input, an inverting input, and an output, said voltage monitor circuit portion being arranged such that:
the non-inverting input of the op-amp is connected to the voltage across the gate-controlled switching device; and
the non-inverting input of the op-amp is connected to the voltage across the gate-controlled switching device via a resistive-capacitive (RC) network, wherein a first terminal of a resistor is connected to the non-inverting input of the op-amp, a second terminal of the resistor is connected to a first terminal of a capacitor at a node, and a second terminal of the capacitor is connected to the voltage across the gate-controlled switching device.

2. The gate driver circuit as claimed in claim 1, wherein the voltage applied across the gate-controlled switching device is a drain-source voltage of the gate-controlled switching device.

3. The gate driver circuit as claimed in claim 1, wherein the current through the gate-controlled switching device is a drain-source current of the gate-controlled switching device.

4. The gate driver circuit as claimed in claim 1, wherein the inverting input of the op-amp is connected to the output of the op-amp via a resistive feedback network, said resistive feedback network comprising a first feedback resistor connected between the output and inverting input of the op-amp, and a second feedback resistor connected between the inverting input and ground.

5. The gate driver circuit as claimed in claim 4, wherein a further resistor is connected between ground and the node between the resistor and capacitor.

6. The gate driver circuit as claimed in claim 1, wherein the voltage monitor circuit portion comprises a transistor having a first terminal thereof connected to the node between the resistor and capacitor, a second terminal thereof connected to ground, and a gate terminal thereof connected to the alternating input signal.

7. The gate driver circuit as claimed in claim 1, wherein the current monitor circuit portion comprises an op-amp having a non-inverting input, an inverting input, and an output, wherein the non-inverting input of the op-amp is arranged to receive a voltage that is dependent on a rate of change of the current through the gate-controlled switching device, said non-inverting input of the op-amp being connected to a terminal of the gate-controlled switching device via a resistive-capacitive (RC) ladder network.

8. The gate driver circuit as claimed in claim 7, wherein the RC ladder network comprises a plurality of resistors and a plurality of capacitors, wherein the plurality of resistors are connected in series between the gate-controlled switching device and the non-inverting input of the op-amp, and wherein the plurality of capacitors are connected such that a first terminal of each capacitor is connected to a node between a pair of adjacent resistors, and such that a second terminal of each capacitor is connected to ground.

9. The gate driver circuit as claimed in claim 7, wherein the inverting input of the op-amp is connected to the output of the op-amp via a resistive feedback network, said resistive feedback network comprising a first feedback resistor connected between the output and inverting input of the op-amp, and a second feedback resistor connected between the inverting input and ground.

10. The gate driver circuit as claimed in claim 7, wherein the RC ladder network is connected to the terminal of the gate-controlled switching device via an inductor.

11. The gate driver circuit as claimed in claim 10, wherein the inductor comprises a parasitic inductance inside the gate-controlled switching device.

12. The gate driver circuit as claimed in claim 1, wherein the compensator comprises a summing amplifier arranged to receive the alternating input signal and the time derivatives of the voltage and current and to produce the modulated control signal at an output thereof.

13. The gate driver circuit as claimed in claim 1, wherein the compensator comprises a digital controller.

14. The gate driver circuit as claimed in claim 1, further comprising a push-pull circuit portion, said push-pull circuit portion comprising a PNP BJT and an NPN BJT, arranged such that:
a collector terminal of the PNP BJT is connected to a positive drive supply voltage;
a collector terminal of the NPN BJT is connected to a negative drive supply voltage;
an emitter terminal of the PNP BJT is connected to an emitter terminal of the NPN BJT, wherein said emitter terminals are further connected to the gate terminal of the gate-controlled switching device; and
a base terminal of the PNP BJT is connected to a base terminal of the NPN BJT, wherein said base terminals are further connected to the output of the compensator.

15. A gate driver circuit for driving a gate-controlled switching device, the gate driver circuit comprising:
a voltage monitor circuit portion arranged to produce a first value that is dependent on a time derivative of a voltage applied across the gate-controlled switching device;
a current monitor circuit portion arranged to produce a second value that is dependent on a time derivative of a current through the gate-controlled switching device;
a compensator arranged to receive an alternating input signal, the first value that is dependent on the time derivative of the voltage, and the second value that is dependent on the time derivative of the current, wherein the compensator is arranged to modulate a magnitude and transition profile of the alternating input signal in response to the respective time derivatives of the voltage and the current, thereby generating a modulated control signal;
wherein the gate driver circuit is arranged to supply the modulated control signal to a gate terminal of the gate-controlled switching device;

wherein the current monitor circuit portion comprises an op-amp having a non-inverting input, an inverting input, and an output, wherein the non-inverting input of the op-amp is arranged to receive a voltage that is dependent on a rate of change of the current through the gate-controlled switching device, said non-inverting input of the op-amp being connected to a terminal of the gate-controlled switching device via a resistive-capacitive (RC) ladder network.

16. The gate driver circuit as claimed in claim 15, wherein the inverting input of the op-amp is connected to the output of the op-amp via a resistive feedback network, said resistive feedback network comprising a first feedback resistor connected between the output and inverting input of the op-amp, and a second feedback resistor connected between the inverting input and ground.

17. The gate driver circuit as claimed in claim 15, wherein the voltage monitor circuit portion comprises a transistor having a first terminal thereof connected to the node between a resistor and a capacitor, a second terminal thereof connected to ground, and a gate terminal thereof connected to the alternating input signal.

* * * * *